United States Patent
Ohsawa et al.

(10) Patent No.: US 6,465,279 B2
(45) Date of Patent: Oct. 15, 2002

(54) LEAD FRAME AND PRODUCTION METHOD THEREOF, AND SEMICONDUCTOR DEVICE AND FABRICATION METHOD THEREOF

(75) Inventors: Kenji Ohsawa; Hidetoshi Kusano, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/942,202

(22) Filed: Aug. 29, 2001

(65) Prior Publication Data

US 2002/0031862 A1 Mar. 14, 2002

Related U.S. Application Data

(62) Division of application No. 09/733,532, filed on Dec. 8, 2000, now Pat. No. 6,340,840.

(30) Foreign Application Priority Data

Dec. 14, 1999 (JP) ............................................. 11-353939

(51) Int. Cl.[7] ........................ H01L 21/44; H01L 21/48; H01L 21/50
(52) U.S. Cl. ...................................... 438/123; 438/112
(58) Field of Search ................................. 438/112, 123

(56) References Cited

U.S. PATENT DOCUMENTS

| | | | | |
|---|---|---|---|---|
| 4,649,415 A | * | 3/1987 | Herbert ...................... | 257/668 |
| 4,800,419 A | * | 1/1989 | Long et al. ................. | 257/668 |
| 4,811,081 A | * | 3/1989 | Lyden et al. ................ | 257/668 |
| 5,214,845 A | * | 6/1993 | King et al. .................... | 29/841 |
| 5,252,854 A | * | 10/1993 | Arita et al. .................. | 257/676 |
| 5,293,066 A | * | 3/1994 | Tsumura ...................... | 257/668 |
| 5,530,282 A | * | 6/1996 | Tsuji ........................... | 257/666 |
| 5,554,886 A | * | 9/1996 | Song et al. ................... | 257/666 |
| 5,608,260 A | * | 3/1997 | Carper et al. ................ | 257/666 |
| 5,646,831 A | * | 7/1997 | Manteghi et al. ........... | 361/813 |
| 6,034,422 A | * | 3/2000 | Horita et al. ................ | 257/667 |
| 6,037,653 A | * | 3/2000 | Kim et al. ................... | 257/666 |
| 6,150,711 A | | 11/2000 | Kom et al. .................. | 257/677 |
| 6,340,840 B1 | * | 1/2002 | Ohsawa et al. .............. | 257/672 |

* cited by examiner

*Primary Examiner*—David L. Talbott
*Assistant Examiner*—David A. Zarneke
(74) *Attorney, Agent, or Firm*—Sonnenschein, Nath & Rosenthal

(57) ABSTRACT

A lead frame comprises: outer leads formed by a metal base member; first interconnection film portions formed by a metal plating layer, each of which is disposed inside the outer leads in such a manner as to be connected to an inner end of one principal plane of the corresponding one of the outer leads, and at least one second interconnection film portion formed by the metal plating layer, which is disposed inside the outer leads in such a manner as not to be connected to the outer leads; and an insulating film formed to cover planes, opposed to the outer leads, of the first and second interconnection film portions, thereby holding the first and second interconnection film portions; wherein planes, opposed to the insulating film, of the first and second interconnection film portions are taken as semiconductor element mounting planes. With this configuration, the lead frame allows a plurality of semiconductor elements to be mounted on one semiconductor device without increasing the number of assembling steps, while making the thickness of the semiconductor device thin, and reducing the reliability and the production yield.

4 Claims, 3 Drawing Sheets

LEAD FRAME AND PRODUCTION METHOD THEREOF, AND SEMICONDUCTOR DEVICE AND FABRICATION METHOD THEREOF

CROSS REFERENCE TO RELATED APPLICATION

This is a division of U.S. Ser. No. 09/733,532 filed Dec. 8, 2000 which claims priority of Japanese application P11-353939 filed Dec. 14, 1999, now U.S. Pat. No. 6,340,840.

BACKGROUND OF THE INVENTION

The present invention relates to a lead frame and a production method thereof, and a semiconductor device using the lead frame and a fabrication method thereof.

Referring to FIG. 4, there is shown one related art semiconductor device using a lead frame generally designated by character "a". The lead frame "a" has a number of leads "b", and a die pad "c" on which a semiconductor element "d" is bonded by means of an adhesive "e". It should be noted that the die pad "c" is depressed for making the thickness of the semiconductor device as thin as possible. Respective electrodes of the semiconductor element "d" are connected to the corresponding leads "b" via bonding wires "f". The semiconductor element "d" thus mounted is then sealed with a sealing resin "g".

Referring to FIG. 5, there is shown another related art semiconductor device using a lead frame generally designated by character "a". In this example, to mount a plurality of semiconductor elements "d", the lead frame "a" includes a printed circuit board "h" having an interconnection film for connecting the plurality of semiconductor elements "d" to each other. To be more specific, the printed circuit board "h" is bonded on a die pad "c" of the lead frame "a" by means of an adhesive "e", the plurality of semiconductor elements "d" are mounted on the printed circuit board "h", electrodes of the semiconductor elements "d" are connected to the interconnection film on the printed circuit board "h" via bonding wires "f", and the interconnection film on the printed circuit bard "h" is connected to leads "b" via bonding wires "f".

In the case of mounting the plurality of semiconductor elements "d", it is required to provide a number of interconnections for connecting the semiconductor elements "d" to each other. For the semiconductor device shown in FIG. 5, such interconnections are configured as interconnection portions obtained by patterning the interconnection film on the printed circuit board "h".

The related art semiconductor device shown in FIG. 4, however, has a problem that it cannot incorporate a plurality of semiconductor elements "d" because the lead frame "a" has no function as interconnections for connecting the plurality of semiconductor elements "d" to each other.

In recent years, along with strong demands toward multiple functions, higher degree of integration, and miniaturization of semiconductor devices, it has been required to incorporate a plurality of semiconductor elements (LSI chips) in one semiconductor device. From this viewpoint, the semiconductor device shown in FIG. 4, which cannot meet such a requirement, should be regarded as being poor in usability.

On the contrary, the semiconductor device shown in FIG. 5 can mount a plurality of semiconductor elements "d" by connecting them to each other via the printed circuit board "h", and therefore, it can meet the above-described demands toward multiple functions and higher degree of integration, and the like. In this regard, the semiconductor device shown in FIG. 5 is superior to the semiconductor device shown in FIG. 4.

The semiconductor device shown in FIG. 5, however, has problems caused by use of the printed circuit board "h". The first problem lies in that since the printed circuit board "h" is additionally provided, the thickness of the semiconductor device is correspondingly increased. For a semiconductor device particularly required to be thinly designed, even a slight increase in thickness equivalent to the thickness of a printed circuit board may be often non-negligible.

The second problem lies in that a positional deviation inevitably occurs between the printed circuit board "h" and the lead frame "a" upon connection therebetween, with a result that it is difficult to ensure a necessary accuracy in positioning the printed circuit board "h" to the lead frame "a".

The third problem lies in that since the production process requires the additional step of connecting the bonding wires "f" made from gold or the like to the interconnection film on the printed circuit board "h" by means of expensive means such as brazing, the production cost is raised, for example. Although the technique of bonding the wires "f" made from gold or the like to the lead frame "a" has been already established, the technique of connecting the wires "f" to the printed circuit board "h" by means of die bonding or wire bonding has been little performed, and therefore, has been not established yet. As a result, if the technique of connecting the wires "f" to the printed circuit board "h" is carried out, there occur inconveniences associated with degradation in yield, reliability, and cost. That is to say, the process of producing the semiconductor device shown in FIG. 5 by using the technique of connecting the wires "f" to the printed circuit board "h" is poor in practical utility.

Additionally, it may be considered to use a TAB tape in place of the printed circuit board "h"; however, in this case, since the TAB tape must be connected to the lead frame, there arise problems that the same positional deviation as described above occurs, and that the connection of the TAB tape to the lead frame is complicated, and since the connection is performed at a high temperature, the TAB tape may be deformed due to a residual stress caused by heat generated upon high temperature connection, with a result that it is very difficult to stably connect the TAB tape to the lead frame. Accordingly, like the process of producing the semiconductor device using the printed circuit board, the process of producing the semiconductor device using the TBA tape is poor in practical utility.

SUMMARY OF THE INVENTION

An object of the present invention is to provide a lead frame having interconnection means capable of electrically connecting a plurality of semiconductor elements mounted on the lead frame, thereby mounting the plurality of semiconductor elements on one semiconductor device, and to provide a semiconductor device using the lead frame, which device can desirably mount a plurality of semiconductor elements while thinning the thickness of the semiconductor device, and which can be produced without increasing the number of assembling steps and degrading the reliability and yield.

To achieve the above object, according to a first aspect of the present invention, there is provided a lead frame including: outer leads formed by a metal base member; first interconnection film portions formed by a metal plating layer, each of which is disposed inside the outer leads in such a manner as to be connected to an inner end of one principal plane of the corresponding one of the outer leads, and at least one second interconnection film portion formed by the metal plating layer, which is disposed inside the outer leads in such a manner as not to be connected to the outer leads; and an insulating film formed to cover planes, opposed to the outer leads, of the first and second interconnection film portions, thereby holding the first and second interconnection film portions; wherein planes, opposed to the insulating film, of the first and second interconnection film portions are taken as semiconductor element mounting planes.

With this configuration, since the lead frame has the first and second interconnection film portions, semiconductor elements mounted on the lead frame can be electrically connected to each other via the second interconnection film portion not connected to the outer leads. Since the second interconnection film portion not connected to the outer leads is held by the insulating film, it can be kept in its position although being separated from the outer leads. Accordingly, a plurality of semiconductor elements can be mounted on the lead frame. Further, since the interconnection film portions are formed, inside the outer leads formed by the metal base member, on one surface side of the outer leads, and the planes, on the outer lead side, of the interconnection film portions are taken as the semiconductor mounting planes, the thickness of the portion, on which the semiconductor elements are formed, of the semiconductor device using the lead frame does not contain the thickness of the metal base member constituting the outer leads. Accordingly, it is possible to make the semiconductor device using the lead frame thinner.

According to a second aspect of the present invention, there is provided a method of producing a lead frame, including the steps of: preparing a metal base member for forming outer leads; forming interconnection film portions made from a metal on one surface of the metal base member by selective plating; etching both surfaces of the metal base member, to form at least outer leads; forming an insulating film on the surfaces of the interconnection film portions, thereby holding the interconnection film portions by the insulating film; and selectively etching the other surface of the metal base member, to expose semiconductor element mounting planes, opposed to the insulating film, of the interconnection film portions.

With this configuration, since the interconnection film portions are formed on one surface of the metal base member for forming the outer leads by selectively plating and the insulating film for holding the interconnection film portions is formed on the surfaces of the interconnection film portions, the state of holding the interconnection film portions by the insulating film can be obtained at this step. Accordingly, the second interconnection film portion for connecting the semiconductor elements to each other can be kept as being mechanically separated from the outer leads by the insulating film.

Further, since the interconnection film portions are exposed by selectively etching the metal base member so as to remove the portion, inside the outer leads, of the metal base member, the exposed planes of the interconnection film portions can be taken as the semiconductor element mounting planes. Also, since the semiconductor element mounting planes are formed on the selectively etched side of the metal base member, the thickness of the portion, on which the semiconductor elements are mounted, of the semiconductor device using the lead frame, does not contain the thickness of the metal base member constituting the outer leads. As a result, it is possible to make the semiconductor device using the lead frame thinner.

According to a third aspect of the present invention, there is provided a semiconductor device including: a lead frame including outer leads formed by a metal base member; first interconnection film portions formed, each of which is disposed inside the outer leads in such a manner as to be connected to an inner end of one principal plane of the corresponding one of the outer leads, and at least one second interconnection film portion, which is disposed inside the outer leads in such a manner as not to be connected to the outer leads; and an insulating film formed to cover planes, opposed to the outer leads, of the first and second interconnection film portions, thereby holding the first and second interconnection film portions; wherein semiconductor elements are mounted on planes, opposed to the insulating film, of the first and second interconnection film portions of the lead frame, and sealed with a sealing resin.

With this configuration, since the semiconductor device is configured by using the lead frame according to the first aspect of the present invention, it can exhibit the same advantages as those of the lead frame according to the first aspect.

According to a fourth aspect of the present invention, there is provided a method of fabricating a semiconductor device, including the steps of: preparing a metal base member for forming outer leads; forming interconnection film portions made from a metal on one surface of the metal base member by selective plating; forming an insulating film on the surfaces of the interconnection film portions, thereby holding the interconnection film portions by the insulating film; selectively etching both surfaces of the metal base member, to form at least outer leads; selectively etching the other surface of the metal base member, to expose semiconductor element mounting planes, opposed to the insulating film, of the interconnection film portions; mounting semiconductor elements on the semiconductor element mounting planes of the interconnection film portions; and sealing the semiconductor elements thus mounted with a sealing resin.

With this configuration, since the semiconductor device is fabricated by using the lead frame produced by the production method according to the second aspect of the present invention, it can exhibit the same advantages as those of the production method according to the second aspect.

BRIEF DESCRIPTION OF THE DRAWINGS

FIGS. 1A to 1H are sectional views illustrating a first embodiment of a method of producing a lead frame according to the present invention in the order of production steps, wherein FIG. 1H shows a first embodiment of the lead frame of the present invention;

FIGS. 2A to 2D are sectional views illustrating a first embodiment of a method of producing a semiconductor device according to the present invention in the order of production steps, wherein FIG. 1D shows a first embodiment of a semiconductor device of the present invention;

DETAILED DESCRIPTION OF THE PREFERRED EMBODIMENTS

Figure 1A:
Figure 1B:
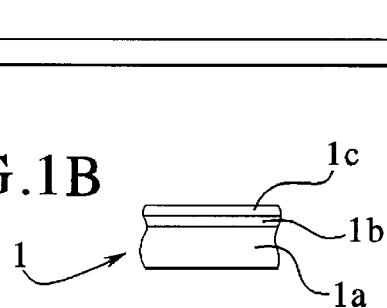

A lead frame of the present invention includes outer leads formed by a metal base member; first interconnection film portions and at least one second interconnection film portions, which are formed of a metal plating layer and are provided inside the outer leads, the first interconnection film portions being each connected to an inner end of one principal plane of the corresponding one of the outer leads, and the at least one second interconnection film portion being not connected to the outer leads; and an insulating film formed to cover planes, opposed to the outer leads, of the first and second interconnection film portions, thereby holding the first and second interconnection film portions; wherein planes, opposed to the insulating film, of the first and second interconnection film portions are taken as semiconductor element mounting planes.

The functions of the components of the above lead frame will be described below.

In production of the lead frame, a metal base member is first prepared.

The metal base member may be mainly made from copper or a copper alloy, and may be formed to have a thickness of about 150 $\mu$m, for example.

The metal base member may be of a multi-layer structure in which an etching stop layer (thickness: about 2 $\mu$m, for example) made from nickel or a nickel alloy is formed on the surface of the layer made from copper or a copper alloy. The etching stop layer is effective to prevent interconnection film layers, which are formed on the metal base member, from being etched when outer leads are formed by selectively etching the metal base member. Alternatively, the metal base member may be of a one layer structure, and in this case, the metal layer as the etching layer may be formed on the metal base member by selective plating before formation of the interconnection film portions by selective plating.

The metal base member is selectively etched from the side, opposed to the side on which the interconnection film portions are formed, until the interconnection film portions are exposed, to remove the portion, located inside the outer leads, of the metal base member. The exposed planes of the interconnection film portions are taken as semiconductor element mounting planes. In this selective etching, if the stop timing of the etching is later, the interconnection film portions are etched, and if the stop timing of the etching is earlier, the interconnection film portions are not exposed because of the lack of etching. In this way, the determination of the stop timing of the etching is difficult. According to the present invention, to suitably determine the stop timing of the etching for certainly preventing over-etching of the interconnection film portions, the etching stopper is provided.

A metal layer (thickness: about 0.2 $\mu$m, for example) made from copper or the like may be formed on the surface of the etching stop layer made from nickel or a nickel alloy. The metal layer made from copper is effective to enhance adhesion with the interconnection film portions formed by selective plating. In this case, the metal base member is of a three layer structure having the main copper layer, the etching stopper layer, and the adhesion enhancing layer. Alternatively, the metal base member may be of a one layer structure, and in this case, both the etching stopper layer and the adhesion enhancing layer may be formed on the metal base member by selective plating before formation of the interconnection film portions by selective plating.

The interconnection film portions are formed on the surface of the metal base member by selective plating. To be more specific, one surface of the metal base member is selectively masked with a resist film having a pattern having a negative relationship to the pattern of an interconnection layer to be formed, and a metal is plated on the metal base member. In the case of using the metal base member having a three layer structure, after formation of the patterned resist film, the interconnection film portions are formed on the metal base member. Meanwhile, in the case of using the metal base member having a one layer structure, after formation of the patterned resist film, the adhesion enhancing layer and the etching stopper layer are sequentially formed, and then the interconnection film portions are formed thereon.

The interconnection film portions may be made from copper, and more preferably, before formation of the interconnection film portions by plating copper, a metal layer for enhancing a bonding characteristic, typically, made from gold (or silver, palladium or the like) may be formed. The thickness of the bonding characteristic enhancing layer may be set to about 0.3 $\mu$m, for example.

The above-described configuration of the lead frame is adapted for the application in which semiconductor elements are mounted thereon by flip-chip bonding. On the other hand, in the case of the lead frame adapted for the application in which semiconductor elements are mounted thereon by wire bonding, since the wire bonding is performed by using ultrasonic waves, a metal layer (thickness: 10 $\mu$m, for example) for ensuring a resistance against ultrasonic oscillation, typically, made from nickel may be interposed between the bonding characteristic enhancing layer made from gold and the main interconnection layer made from copper. The reason for this is that the bonding characteristic enhancing layer made from a soft metal such as gold may release ultrasonic oscillation to the main interconnection layer side, thereby possibly failing to perform satisfactory wire bonding; however, if the metal layer for ensuring a resistance against ultrasonic oscillation is interposed between the bonding characteristic enhancing layer and the main interconnection layer, the release of ultrasonic oscillation to the main interconnection layer side can be prevented by the metal layer for ensuring a resistance against ultrasonic oscillation.

The interconnection film portions formed on the surface of the metal base member are composed of the first interconnection film portions connected to the outer leads, and the second interconnection film portion not connected to the outer leads. The first interconnection film portions connected to the outer leads function as means for connecting a plurality of semiconductor elements (LSI chips, for example) incorporated in the semiconductor device to external terminals outside the semiconductor device, and the second interconnection film portion not connected to the outer leads functions as means for connecting electrodes of the semiconductor elements to each other.

After formation of the interconnection film portions, the metal base member is selectively etched for forming the contours of the outer leads and the contour of the lead frame, and then an insulating film for covering the interconnection film portions is formed. The insulating film, typically made from polyimide, not only exhibits an insulating property but also plays a role in holding the interconnection film portions. As a result, the second interconnection film portion separated from the outer leads after removal of the portion, located inside the outer leads, of the metal base member, can be kept in its position by the insulating film. According to the present invention, therefore, since the second interconnection film portion only functioning to connect a plurality of semiconductor elements to each other can be kept as being separated from the outer leads, a plurality of semiconductor elements can be mounted on the lead frame without use of a printed circuit board or TAB tape.

The portion, located inside the outer leads, of the metal base member is removed from the surface side, opposed to the side on which the interconnection film portions are formed, of the metal base member by selective etching. In the case of using the metal base member including the etching stop layer made from nickel or a nickel alloy and the adhesion enhancing layer made from copper, it is required to remove the main copper layer of the metal base member by selective etching and remove the etching stop layer by overall etching. If not so, there occurs an inconvenience that the outer leads are short-circuited to each other via the metal layer and the interconnection film portions for mounting semiconductor elements cannot be exposed.

After completion of the above-described steps, the lead frame is accomplished. Semiconductor elements, if they are of a type requiring wire bonding, are mounted on the lead frame thus obtained by carrying out the die bonding, wire bonding, resin sealing, external plating, and lead cut forming steps. Meanwhile, semiconductor elements, if they are of a type requiring flip-chip bonding, are mounted on the lead frame by carrying out the flip-chip bonding, resin sealing, external plating, and lead cut forming steps.

Hereinafter, the present invention will be more fully described by way of embodiments shown in FIGS. 1A to 1H, FIGS. 2A to 2D, and FIG. 3.

FIGS. 1A to 1H are sectional views illustrating a first embodiment of a method of producing a lead frame according to the present invention in the order of production steps.

(1) As shown in FIG. 1A, a metal base member 1 is prepared. The metal base member 1 may be of a one layer structure made from copper or a copper alloy, or may be, as shown on the lower side of FIG. 1B of a three layer structure having a metal layer 1a (thickness: 150 μm) made from copper or a copper alloy, which layer 1a will be taken as outer leads later; an etching stop layer 1b (thickness: 0.1 to 2 μm) made from nickel or a nickel alloy and formed on the surface of the metal layer 1a, which layer 1b functions as an etching stopper; and a thin copper layer (thickness: 0.2 μm, for example) formed on the surface of the etching stop layer 1b. The thin copper film 1c is formed for enhancing adhesion with interconnection film portions which will be described later.

Figure 1C:
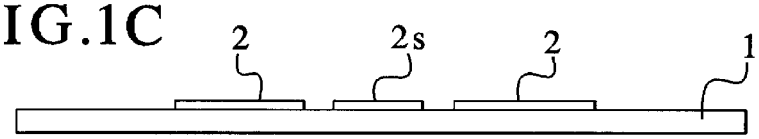

(2) As shown in FIG. 1C, two interconnection film portions 2 and one interconnection film portion 2s, for example are formed on the metal base member 1 by a selective plating method. Concretely, the selective plating is performed by coating the surface of the metal base member 1 with a resist film, patterning the resist film by exposure and development, and plating the following metals on the surface of the metal base member 1 by using the patterned resist film as a mask.

Figure 1D:
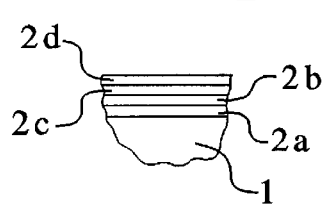

In the case of using the metal base member 1 having a one layer structure, as shown in FIG. 1D, a nickel layer 2a functioning as an etching stopper, a gold metal 2b for ensuring a bonding characteristic, a nickel layer 2c, for enhancing a resistance against ultrasonic oscillation, and a copper layer 2d functioning as an interconnection main body are formed in sequence on the metal base member 1 by plating nickel, gold, nickel, and copper thereon in this order by using the patterned resist film as a mask.

Figure 1E:
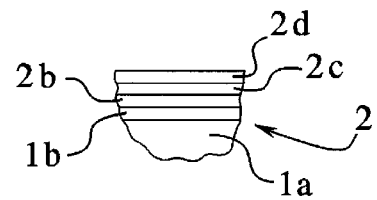

In the case of using the metal base member 1 having a three layer structure, since the metal base member 1 has the nickel layer 1b functioning as the etching stopper, as shown in FIG. 1E, the gold layer 2b, the nickel layer 2c, and the copper layer 2d are formed in sequence on the metal base member 1 by plating gold, nickel, and copper in this order thereon using the patterned resist film as a mask. In addition, the uppermost thin copper film 1c of the metal base member 1 is lost at the above-described plating step.

It should be noted that since the lead frame in this embodiment is of a type of mounting semiconductor elements thereon by ultrasonic wire bonding, the nickel layer 2c for enhancing the resistance against ultrasonic oscillation is provided; however, if the lead frame is of a type of mounting semiconductor devices thereon by flip-chip bonding, the nickel layer 2c for enhancing the resistance against ultrasonic oscillation is not required to be provided, and in this case, the number of layers is correspondingly reduced.

With respect to the interconnection film portions 2 and 2s, the interconnection film portions 2 are to be connected to outer leads which will be formed later, and the interconnection film portion 2s is not to be connected to, that is, separated from the outer leads and is to be used to electrically connect a plurality of semiconductor elements to be mounted thereon to each other.

Figure 1F:
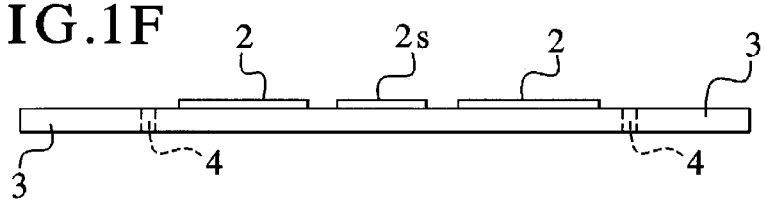

(3) As shown in FIG. 1F, both surfaces of the metal base member 1 are selectively etched, to form contours of outer leads 3 and a contour of a lead frame, and also to form guide holes for accurately feeding the lead frame, and the like. In FIG. 1F, reference numeral 4 designates a slit formed by selective etching. It should be noted that at this selective etching. It should be noted that at this selective etching step, inner end sides of the outer leads 3 are not etched at all, and that the outer leads 3 are finally shaped by lead cut forming after resin sealing.

Figure 1G:
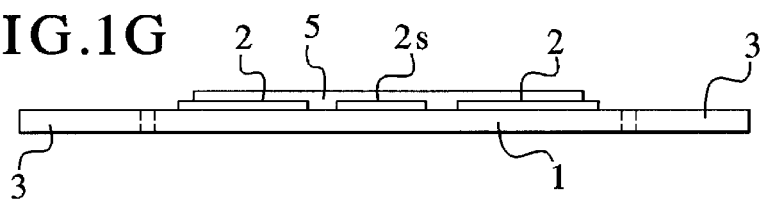

(4) As shown in FIG. 1G, an insulating film 5 (thickness: 25 μm) made from polyimide is formed on the surfaces of the interconnection film portions 2 and 2s by printing. The insulating film 5 may be formed by adhesively bonding a photosensitive insulating material layer or adhesively bonding a polyimide layer and forming a photosensitive film thereon, and patterning the insulating material layer or the film and polyimide layer by selective etching. The insulating film 5 plays an important role not only in protecting the interconnection film portions 2 and 2s until the resin sealing step but also in stably holding the positional relationship between the interconnection film portion 2s separated from the outer leads 3 and the other interconnection film portions 2 when the interconnection film portions 2s and 2 are exposed by selective etching of the metal base member 1 for forming the outer leads (which will be described later) and overall etching of the etching stopper 2a or 1b (which will be also described later). In this way, the interconnection film portions 2s can be kept as being separated from the outer leads 3 by the presence of the insulating film 5, so that a plurality of semiconductor devices can be electrically connected to each other by means of the interconnection film portions 2s, and the semiconductor elements thus electrically connected to each other can be mounted on one lead frame without occurrence of any problem.

Figure 1H:
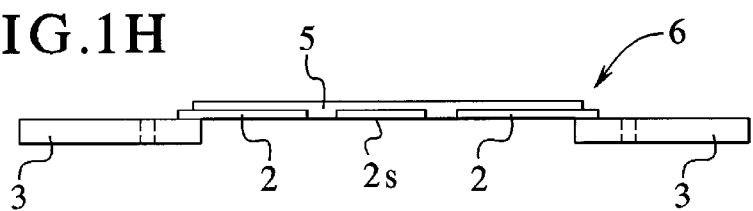

(5) As shown in FIG. 1H, the metal base member 1 is etched from the back surface side (opposed to the principal plane on which the interconnection film portion 2a and 2s are formed) to expose planes opposed to the insulating film (semiconductor element mounting planes) of the interconnection film portions 2 and 2s, and to substantially perfectly form the contours of the outer leads 3. It should be noted that the outer leads 3 are of course perfectly shaped by the lead cut forming after resin sealing. The above etching includes selective etching for selectively removing the metal base member 1 (or the copper layer 1a) and etching for removing the nickel layer 2a (or 1b) functioning as the etching stopper for the selective etching, which are alternately repeated by several times. In the selective etching, since the nickel layer 2a (or 1b) functions as the etching stopper, the interconnection film portions 2 and 2s are prevented from being etched.

After completion of the step shown in Fix. 1H, the lead frame is accomplished. In this figure, reference numeral 6 designates the lead frame thus accomplished, which lead frame is equivalent to a first embodiment of the lead frame of the present invention.

FIGS. 2A to 2D are sectional views illustrating a first embodiment of a method of producing a semiconductor device according to the present invention in the order of production steps. In this embodiment, a plurality of semiconductor elements are mounted on the above-described lead frame 6.

Figure 2A:
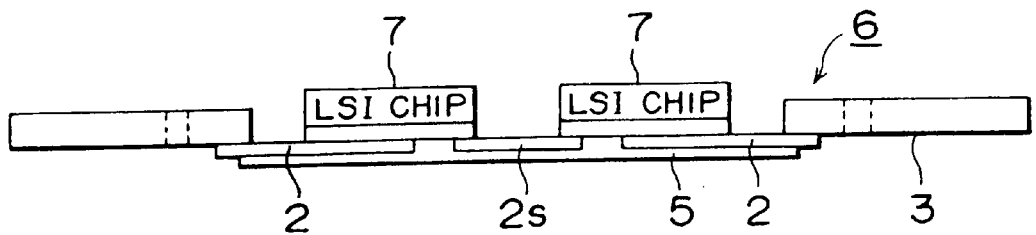

(1) As shown in FIG. 2A, the lead frame 6 is placed in a posture opposed to or turned over from the posture shown in FIG. 1E in the vertical direction, and a plurality of semiconductor elements (LSI chips) 7 are die-bonded on a plane, on which the interconnection film portions 2 and 2s are formed, of the lead frame 6 via insulating paste 8. The planes, on which the semiconductor elements 7 are die-bonded, of the interconnection film portions 2 and 2s are at the same level as that of the one principal plane of the metal base member 1, and accordingly, the thickness of the metal base member 1 does not become a factor of increasing the thickness of the semiconductor device 7 mounting portion. As a result, the use of the lead frame 6 largely contributes to thinning of the semiconductor device.

Figure 2B:
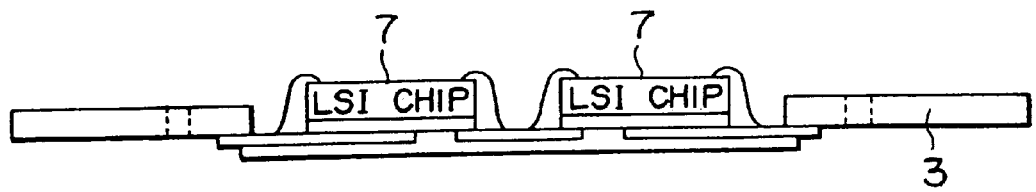

(2) As shown in FIG. 2B, electrodes of the semiconductor elements 7 are bonded to the interconnection film portions 2 and 2s by an ultrasonic wire bonding process. In this wire bonding, since each of the interconnection film portions 2 and 2s has, as the surface layer, the gold layer 2b for ensuring a bonding characteristic, which is formed on the nickel layer 2c for enhancing the resistance against ultrasonic oscillation, the wires 9 can be desirably bonded to the gold layer 2b, which is excellent in bonding characteristic with the wires 9, by effectively applying ultrasonic oscillation to the wires 9

Figure 2C:
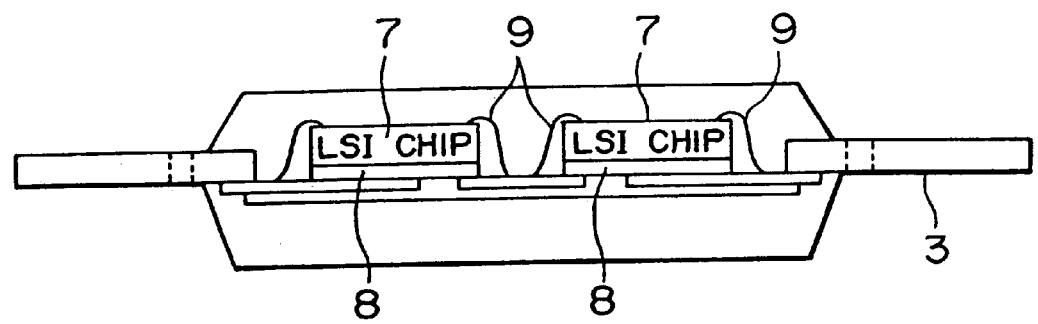

(3) As shown in FIG. 2C, the semiconductor elements 7 thus bonded on the interconnection film portions 2 and 2s are sealed with a sealing resin 10.

Figure 2D:
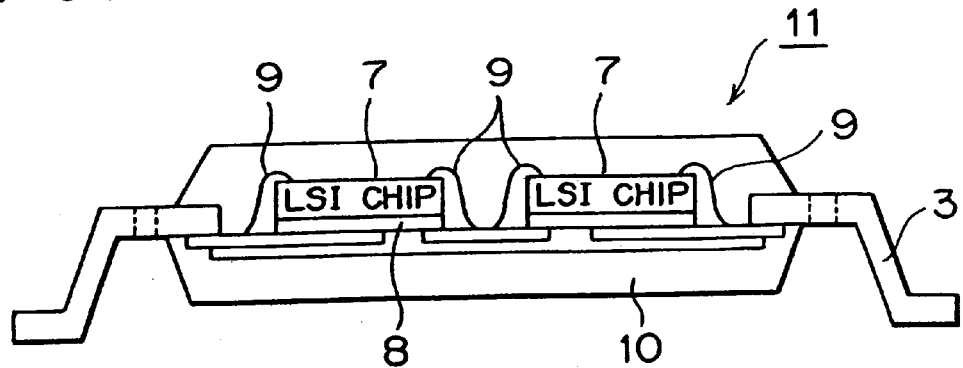

(4) As shown in FIG. 2D, the outer leads 3 are plated, and subjected to lead cut forming, to thereby accomplish a semiconductor device 11. The semiconductor device 11 is a first embodiment of the semiconductor device of the present invention.

The semiconductor device 11 thus obtained has the following advantages:

1. Since the lead frame 6 has the interconnection film portion 2s not connected to the outer leads 3, the semiconductor elements 7 can be electrically connected to each other via the interconnection film portion 2s. This is because the interconnection film portion 2s not connected to the outer leads 3 can be kept at a position separated from the outer leads 3 by the insulating film 5.

Accordingly, a plurality of semiconductor elements 7 can be mounted on the lead frame 6. Further, since interconnections, each of which can connect one point to another point in the lead frame 6, are formed, it is possible to realize the layout with the short interconnection length, and hence to improve electrical characteristics such as reductions in parasitic resistance of an interconnection path, parasitic capacitance, and parasitic induction.

2. Since the interconnection film portions 2 and 2s are formed, inside the outer leads 3 formed by the metal base member 1, on the one surface side of the outer leads 3 (upper side in FIG. 1) and the planes, on the outer lead side, of the interconnection film portions 2 and 2s are taken as the semiconductor element mounting planes, the thickness of a portion, on which the semiconductor elements are mounted., of the semiconductor device 11 using the lead frame 6 does not contain the thickness of the metal base member 1 constituting the outer leads 3. As a result, it is possible to make the thickness of the semiconductor device 11 using the lead frame 6 thinner.

3. Since each of the interconnection film portions 2 and 2s has, as the surface layer on the semiconductor element mounting side, the gold layer 2b excellent in bonding characteristic with the wires 9, which gold layer is formed on the nickel layer 2c for enhancing the resistance against ultrasonic oscillation, the wires 9 can be desirably bonded to the interconnection film layers 2 and 2s by wire bonding.

4. Since the interconnection film portions 2 are formed on the metal base member 1 constituting the outer leads 3 by electrical plating, it is possible to eliminate the need of connecting the interconnection film portions 2 to the outer leads 3 at the later assembling step, and also to enhance the reliability in connection of the interconnection film portions 2 to the outer leads 3. Since the resist film used as a mask for forming the interconnection film portions 2 and 2s by plating is patterned by using the photolithography technique having a high processing accuracy, it is possible to easily enhance the positional accuracy of the interconnection film portions 2 and 2s to the outer leads 3. As a result, it is possible to reduce the production cost of the lead frame 6 and thereby reduce the production cost of the semiconductor device 11 using the lead frame 6.

Figure 3:
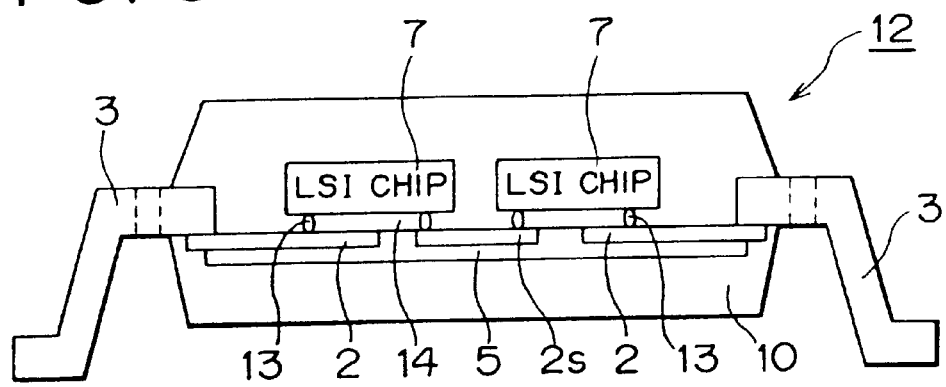
FIG. 3 is a sectional view showing a second embodiment of the semiconductor device of the present invention.
Figure 4:
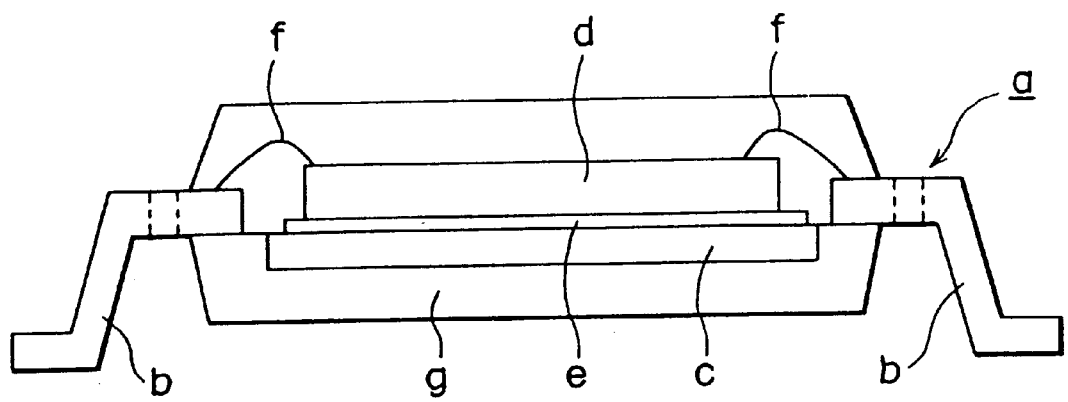
FIG. 4 is a sectional view showing a first related art semiconductor device.
Figure 5:
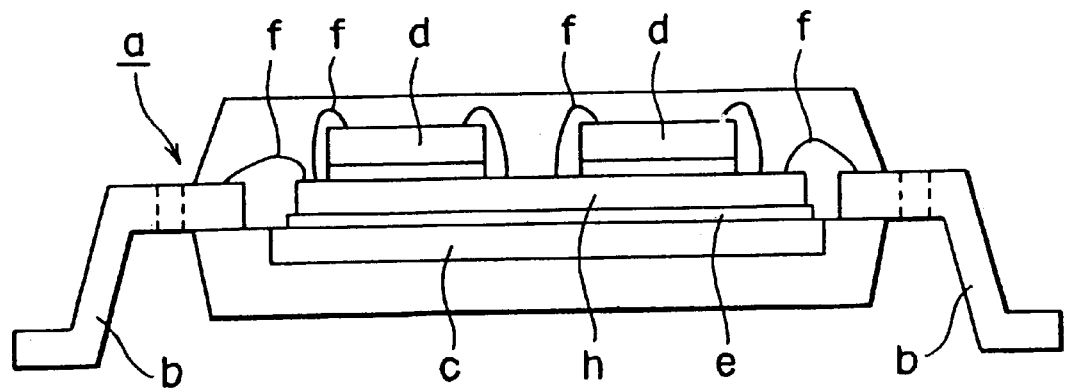
FIG. 5 is a sectional view showing a second related art semiconductor device.

FIG. 3 is a sectional view showing a second embodiment of the semiconductor device of the present invention. Referring to FIG. 3, there is shown a semiconductor device 12 according to the second embodiment, in which semiconductor elements are mounted on a lead frame by flip-chip bonding. Since the semiconductor device 12 is the same as the semiconductor device 11 shown in FIG. 2D except that the semiconductor device 12 is of a type of mounting the semiconductor elements on the lead frame by flip-chip bonding, and therefore, only the difference therebetween will be described in detail. In FIG. 3, parts corresponding to those shown in FIG. 2D are designated by the same characters.

Reference numeral 2 and 2s designate interconnection film portions 2 and 2s, which are different from the interconnection film portions 2 and 2s of the lead frame shown in FIGS. 1A to 1E and FIGS. 2A to 2D in that each of the interconnection film portions 2 and 2s shown in FIG. 3 is of a two layer structure having no metal layer 2b for enhancing the resistance against ultrasonic oscillation. The reason for this is that since the semiconductor elements are bonded to the interconnection film portions 2 and 2s not by ultrasonic wire bonding but by flip-chip bonding, it is not required to provide the metal layer 2b for enhancing the resistance against ultrasonic oscillation. In FIG. 3, reference numeral 13 designates a stud bump made from gold and formed into a projection shape having a height of 40 $\mu$m and a diameter of 60 $\mu$m, and 14 designates an anisotropic conductive adhesive for bonding the semiconductor elements 7 on the interconnection film portions 2 and 2s. The interconnection film portions 2 and 2s are electrically connected to the bumps 13 as electrodes of the semiconductor elements 7 by the anisotropic conduction function of the adhesive 14.

The semiconductor device 12 of the type of mounting the semiconductor elements by flip-chip bonding exhibits not only the same advantage as that of the semiconductor device 11 of the type mounting the semiconductor elements by wire bonding, but also another advantage that since no wire is used, the thickness of the semiconductor device can be made correspondingly thinner.

While the preferred embodiments of the present invention have been described using the specific terms, such description is for illustrative purposes only, and it is to be understood that changes and variations may be made without departing from the spirit or scope of the following claims.

What is claimed is:

1. A method of producing a lead frame, comprising the steps of:

preparing a metal base member for forming outer leads;

forming interconnection film portions made from a metal on one surface of the metal base member by selective plating;

etching both surfaces of the metal base member, to form at least outer leads;

forming an insulating film on the surfaces of the interconnection film portions, thereby holding the interconnection film portions by the insulating film; and selectively etching the other surface of the metal base member, to expose semiconductor element mounting planes, opposed to the insulating film, of the interconnection film portions.

2. A method of producing a lead frame according to claim 1, wherein said step of forming the interconnection film portions on the surface of the metal base member by selective plating comprises the steps of:

forming a metal layer for ensuring a bonding characteristic on the surface of the metal base member by selective plating;

forming a metal layer for enhancing a resistance against ultrasonic oscillation on the metal layer for ensuring a bonding characteristic by selective plating; and forming the interconnection film portions on the metal layer for enhancing a resistance against ultrasonic oscillation by selective plating.

3. A method of producing a lead frame according to claim 1, wherein said step of forming the interconnection film portions on the surface of the metal base member by selective plating comprises the steps of:

forming a metal layer for ensuring a bonding characteristic on the surface of the metal base member by selective plating; and forming the interconnection film portions on the metal layer for ensuring a bonding characteristic by selective plating.

4. A method of fabricating a semiconductor device, comprising the steps of:

preparing a metal base member for forming outer leads;

forming interconnection film portions made from a metal on one surface of the metal base member by selective plating;

forming an insulating film on the surfaces of the interconnection film portions, thereby holding the interconnection film portions by the insulating film;

selectively etching both surfaces of the metal base member, to form at least outer leads;

selectively etching the other surface of the metal base member, to expose semiconductor element mounting planes, opposed to the insulating film, of the interconnection film portions;

mounting semiconductor elements on the semiconductor element mounting planes of said interconnection film portions; and sealing said semiconductor elements thus mounted with a sealing resin.

* * * * *